United States Patent
Arndt et al.

(10) Patent No.: US 6,222,244 B1
(45) Date of Patent: Apr. 24, 2001

(54) ELECTRICALLY BLOWABLE FUSE WITH REDUCED CROSS-SECTIONAL AREA

(75) Inventors: Kenneth C. Arndt, Fishkill, NY (US); Dureseti Chidambarrao, Weston, CT (US); Louis L. Hsu, Fishkill, NY (US); Jack A. Mandelman, Stormville, NY (US); Carl Radens, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/093,903

(22) Filed: Jun. 8, 1998

(51) Int. Cl.[7] .......................... H01L 29/00; H01L 23/58; H01L 23/62; H01L 29/74; H01L 31/111
(52) U.S. Cl. .......................... 257/529; 257/173; 257/530; 257/665; 257/355
(58) Field of Search .................... 257/529, 530, 257/665, 173

(56) References Cited

U.S. PATENT DOCUMENTS

| | | |
|---|---|---|
| 4,647,340 | 3/1987 | Szluk et al. . |
| 5,011,791 | 4/1991 | Mastroianni . |
| 5,282,158 | 1/1994 | Lee . |
| 5,331,196 | 7/1994 | Lowrey et al. . |
| 5,420,456 | 5/1995 | Galbi et al. . |
| 5,465,004 | 11/1995 | Lim et al. . |
| 5,514,900 | * 5/1996 | Iranmanesh .......................... 257/529 |
| 5,536,968 | 7/1996 | Crafts et al. . |
| 5,576,576 | * 11/1996 | Hawley et al. ....................... 257/530 |
| 5,668,065 | 9/1997 | Lin . |
| 5,682,059 | 10/1997 | Yoshii et al. . |
| 5,789,794 | * 8/1998 | Froehner ............................... 257/529 |
| 6,025,226 | 2/2000 | Gambino et al. . |

* cited by examiner

Primary Examiner—Eddie C. Lee
Assistant Examiner—Jesse A. Fenty
(74) Attorney, Agent, or Firm—McGinn & Gibb, PLLC; Todd M. C. Li (57) ABSTRACT

A semiconductor fuse is positioned between conductors for connecting wiring lines. The fuse comprises spacers positioned on adjacent ones of the conductors, and a fuse element positioned between the spacers and connected to the wiring lines. A space between the conductors comprises a first width comprising a smallest possible photolithographic width and the fuse element has a second width smaller than the first width.

8 Claims, 11 Drawing Sheets

ELECTRICALLY BLOWABLE FUSE WITH REDUCED CROSS-SECTIONAL AREA

CROSS REFERENCED TO RELATED APPLICATION

This application is related to co-pending U.S. application Ser. No. 09/093,910 entitled "Sub-minimum Wiring Structure" filed concurrently with this application.

BACKGROUND OF THE INVENTION

1. Field of the Invention

The present invention generally relates to fuses included within semiconductor structures which protect semiconductor devices from excessive voltage and/or current or which selectively and permanently connect/disconnect semiconductor devices from one another.

2. Description of the Related Art

As the size and voltage/current ratings of semiconductor devices becomes smaller, as a result of device miniaturization, the fuses which protect or disconnect such devices must be opened ("blown") with smaller voltages and currents. In an effort to reduce the minimum current/voltage required to open a fuse, conventional fuse structures have a reduced cross-sectional area and have bends in the conductive path to create current crowding. Such structures create a localized high resistance fuse region which causes the fuse to open with smaller voltages and currents.

Figure 1A:
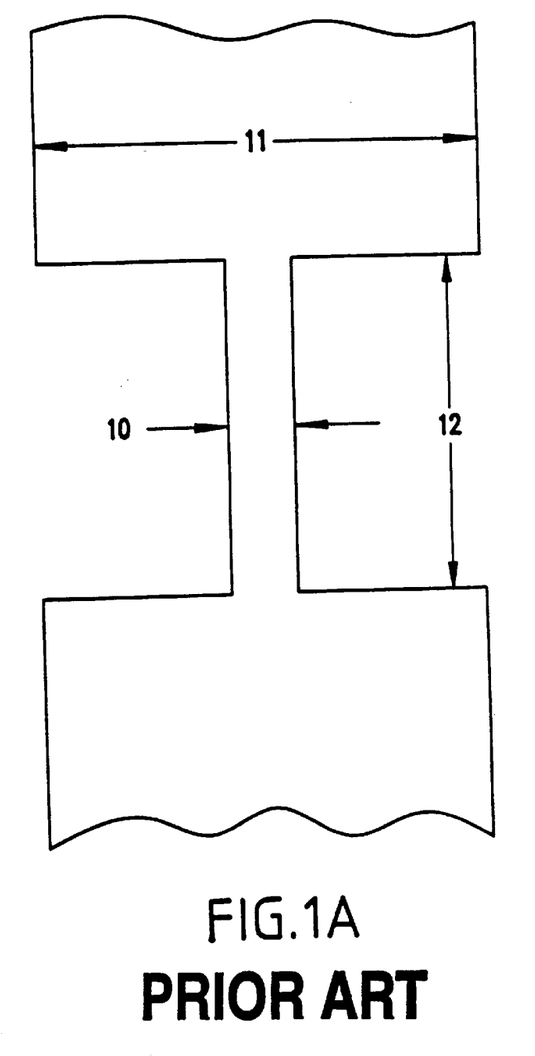
FIG. 1A is a schematic diagram of a conventional fuse.

FIG. 1A illustrates a top view of a conventional current-blow fuse. To reduce the fuse-opening current requirements, conventional fuses make the width of the fuse element (Wf) 10 as small as possible, and make the width of the interconnect conductor (W0) 11 at the end of the fuse as large as possible relative to the length of the fuse element (Lf) 12.

These dimensions result in the fuse resistance being substantially higher than the resistance of the interconnect conductor 11. Furthermore, the step in conductor width (W0 vs. Wf) results in current crowding at the junction of the fuse and the relatively wide interconnect conductor 11. Current crowding also increases the resistance of the fuse and reduces the current required to open the fuse.

Figure 1B:
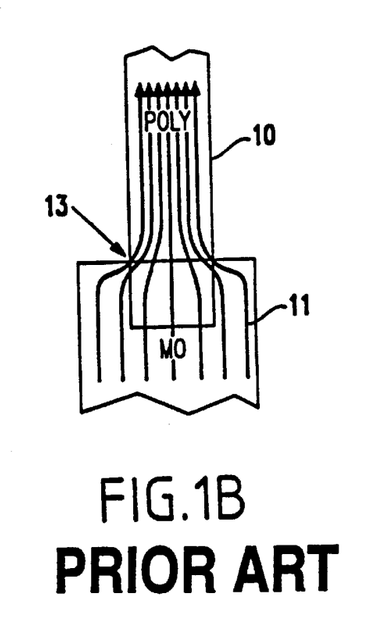
FIG. 1B is a schematic diagram showing the current crowding which occurs in a fuse.

This effect is illustrated by the top view of the region 13 where conductive wiring 11 connects to the fusible link 10 in FIG. 1B. Within the region 13 where current crowding occurs, localized heating is increased. This makes it likely that the fuse will open at this point, when it is desired to be blown. The step in conductor width between conductive wiring and the fusible link, improves the consistency of the location at which the fuse will open. This results in a tighter distribution of blow-current compared to fuses having constant width.

Reduction of the fuse-opening current is important because it allows the size of the fuse drivers to be reduced, resulting in a tight fuse pitch, and allows fuses to be opened with lower voltages.

SUMMARY OF THE INVENTION

It is an object of the present invention to provide a fuse and method for making a fuse which is electrically blowable with normal operating power supply voltages and which allows redundancy and other circuit customization to be implemented at the module level.

The inventive fuse includes a localized high resistance region which creates a temperature high enough to open the fuse with normal operating voltages. Furthermore, the inventive fuse can be fabricated with the standard existing processing steps and is compatible with present dynamic random access memory (DRAM) technologies.

Briefly, the invention includes a semiconductor fuse positioned between conductors for connecting at least two wiring lines. The fuse comprises spacers positioned on adjacent ones of the conductors, and a fuse element positioned between the spacers and connected to the wiring lines. A space between the conductors comprises a first width comprising a smallest possible photolithographic width and the fuse element has a second width smaller than the first width.

The conductors comprise gate conductor stacks. The fuse element is opened with internal operating currents and voltages of the wiring lines. The spacers comprise nitride spacers and the fuse element comprises polysilicon. The fuse element may include a bend. The fuse may also include a void above the fuse element.

The invention also includes a method of forming a semiconductor fuse between at least two conductors and for connecting at least two wiring lines, the method comprising steps of forming spacers on adjacent ones of the conductors, forming a fuse element between the spacers, and connecting the fuse element to the wiring lines.

The invention also includes multiple steps of etching a trench between adjacent ones of the conductors, such that the trench is wider in a top portion than in a bottom portion. The step of forming the fuse element comprises steps of filing the trench with a conductive material, wherein the conductive material has a width dependent etch rate, etching the conductive material, such that the conductive material remains in the bottom portion and is removed from the top portion.

A different embodiment of the invention includes conductors, each of the conductors having a conductive layer and an insulating layer above the conductive layer, wherein a first width between the conductive layers of adjacent conductors is greater than a second width between the insulating layers of the adjacent conductors, first spacers positioned on the insulating layer and the conductive layer of adjacent ones of the conductors, a fuse element positioned between the first spacer of adjacent ones of the conductors and connected to the wiring lines, and second spacers positioned between the fuse element and the first spacers, the second spacers being on a same layer level as the conductive layer, wherein a difference between the first width and the second width is occupied by the second spacers. The second spacers increase thermal insulation of the fuse.

Correspondingly, the invention also includes a method of forming a semiconductor device for connecting at least two wiring lines. The method comprises steps of forming at least two conductors by depositing a conductive layer, depositing an insulating layer above the conductive layer, and etching the conductive layer and the insulating layer to form a trench between adjacent ones of the conductors, undercutting the conductive layer under the insulating layer, forming conformal first spacers on the insulating layer and the conductive layer in the trench, forming second spacers in the trench on the first spacers at a same layer level as the conductive layer, such that an area of the trench equal to an amount of the undercutting is occupied by the second spacers, and filling the trench with a fuse element, the fuse element covering the first spacers and the second spacers. The step of forming the second spacers comprises a step of increasing thermal insulation of the fuse element.

Another embodiment of the invention includes a semiconductor wiring structure positioned between at least two conductors and comprises spacers positioned on adjacent ones of the conductors, and at least one wiring element positioned between the spacers. The conductors comprise gate conductor stacks.

The invention correspondingly includes a method of forming a semiconductor wiring between at least two conductors comprising steps of forming spacers on adjacent ones of the conductors and forming at least one wiring element between the spaces. The conductors comprise gate conductor stacks. The wiring elements have twice the pitch of the maximum possible lithographic wiring pitch. The wiring density of the composite wiring elements and conductors is twice that of wiring produced by conventional lithographic means.

Another embodiment of the invention is a semiconductor resistor/capacitor circuit which comprises a plurality of conductors, spacers positioned on adjacent ones of the conductors, and a capacitive element positioned between the spacers. The conductors comprise gate conductor stacks and act as a resistive element.

The invention correspondingly includes a method of forming a semiconductor resistor/capacitor comprising steps of forming at least two conductors, forming spacers on adjacent ones of the conductors, and forming a capacitive element between the conductors. The conductors comprise gate conductor stacks and act as a resistive element.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

I. First Embodiment

Referring now to the drawings, and more particularly to FIGS. 2–5, a first preferred embodiment of the invention is illustrated.

With the invention, an all electrically blowable fuse is formed between two conducting lines. In the first embodiment described below, the fuse material can comprise any conductive material, such as polysilicon, and is bounded by conducting lines, which in the example of the first embodiment, are gate conductor stacks.

The gate conductors can be any conductive material, such as a composite of N+ doped polysilicon capped by a highly conductive tungsten silicide layer. In the first embodiment, a self-aligned nitride insulating cap covers the silicide layer, and nitride insulating spacers are formed on the sidewalls of the gate conductors. The sidewall insulating spacers allow fuses of sub-minimum widths to be formed.

The conventional purpose of using sidewall insulating spacers and nitride caps in the dynamic random access memory (DRAM) manufacturing process is to prevent shorts between the conducting bitline stud and the adjacent word lines (e.g., the gate conductors). It was not conventionally known to utilize spacers adjacent gate conductor stacks to form a sub-minimum sized fuse.

More specifically, the invention comprises a reduced cross-sectional area (and correspondingly reduced blow-current) fuse using a process which can easily be incorporated into conventional structures and conventional methods for manufacturing advanced DRAM technologies (e.g., 64 MB, 256 Mb, 1 Gb).

Figure 2:
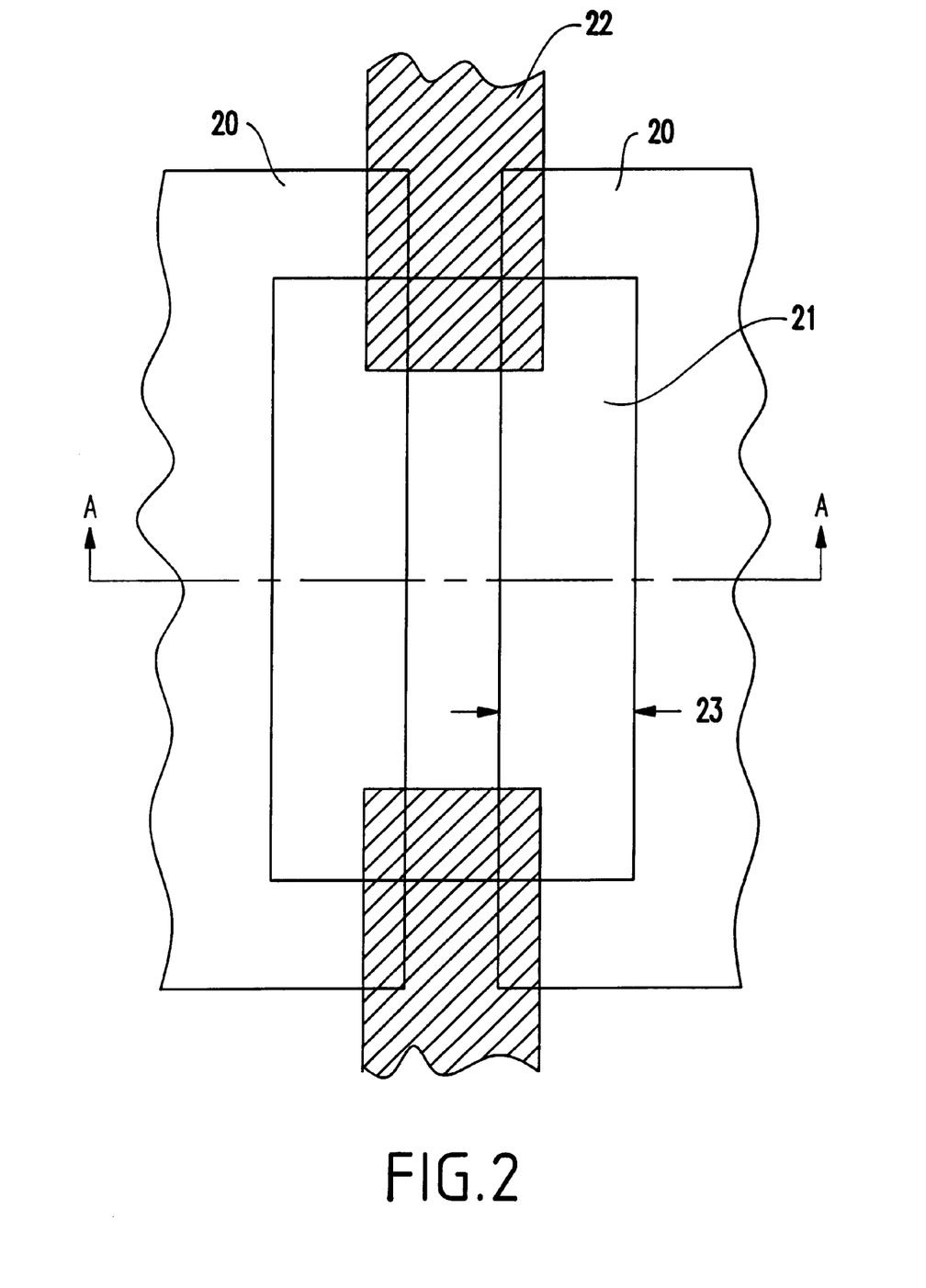
FIG. 2 is a schematic diagram of a top view of a first embodiment of the invention.

The inventive fuse structure 21 is positioned between the gate conductors (GC) 20 and the first conductive wiring metalization layer (M0) 22, as shown by the top view layout in FIG. 2. The inventive fuse 21 comprises a bitline poly stud damascened between the two adjacent gate conductors 20 separated by a minimum space. The conductive wiring 22 provides the low resistance lead-in conductors to the fuse. Thus, the fuse material 21 selectively connects the conductive wiring 22.

Figure 3:
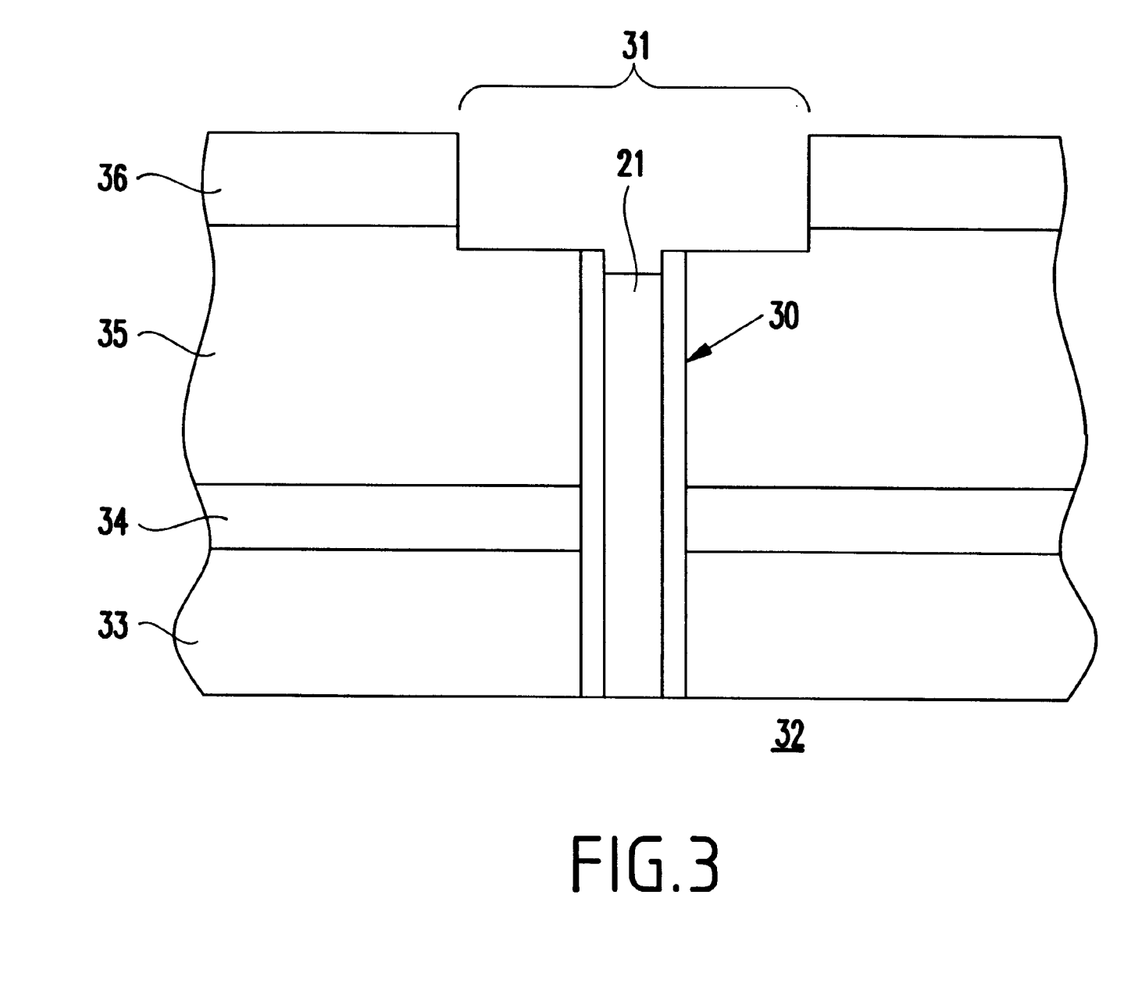
FIG. 3 is a schematic diagram of a cross-sectional the view of a first embodiment of the invention.

The space between the gate conductors 20 is the minimum sized space which can be created by lithographic processes. As shown in FIG. 3 (not to scale), the fuse element 21 is bounded by nitride sidewall spacers 30 within this minimum space. Therefore, the fuse element 21 has a "sub-minimum" size, does not appreciably affect chip layout and design, and allows the fuse to be blown with voltages utilized in conventional DRAM structures.

Processing steps for fabricating the inventive fuse are discussed below. The fuse is fabricated over a shallow trench isolation (STI) region 32 so that the fuse element 21 is thermally and electrically insulated from the underlying silicon substrate.

Following gate oxidation, the gate conductor stack 20 is formed by depositing, for example, layers of polysilicon 33, tungsten silicide 34 and nitride 35, using methods well known to those ordinarily skilled in the art, the details of which are not discussed herein for sake of brevity.

In the region which will contain the fuse element 21, sidewalls of the adjacent minimum spaced gate conductors 20 are defined, again using well known methods. The process is carried through gate conductor sidewall oxidation and formation of the nitride gate conductor sidewall spacers 30.

The structure and materials used in the fuse described herein are chosen as a matter of convenience, since they are already present in the DRAM manufacturing technology currently practiced by those ordinarily skilled in the art.

For example, as would be known by those ordinarily skilled in the art in light of this disclosure, fuse materials other than polysilicon, and gate conductors of different structure and materials, may be employed. It is a matter of what is most easily and economically adaptable to the semiconductor process of interest.

Similarly, the two conductors 20 bounding the fuse may be conductors at wiring levels above the gate level. These conductors are typically metals such as aluminum, tungsten, copper, or composites of these or other metals. The two conductors, or structures, bounding the fuse may even be insulating materials so long as they serve as mandrels between which a sub-minimum width fuse may be formed.

Following conventional source/drain (S/D) implants (not illustrated), the gap between gate conductors 20 is filled with borophosphosilicate glass (BPSG) (not illustrated), planarized, and then covered with a layer of tetraethylorthosilicate (TEOS) 36.

Conventional manufacturing processes use a mask to open bitline contacts (i.e., bitline studs) through the TEOS layer and then fill the bitline contact openings with a conductive material such as polysilicon. The inventive method alters the shape of the bitline contact mask in order to form the sub-minimum fuse structure, without requiring additional processing steps.

More specifically, a bitline contact mask (not illustrated) is used to open a window 31 over the fuse element 21 area and to define openings for normal bitlines contacts (not illustrated) used in other areas of the semiconductor structure. The normal bitline contact openings are generally formed using a near minimum photolithographic image. However, the invention changes the shape of the conventional bitline contact mask such that, in the area where the fuse is to be formed, the bitline contact mask includes an opening that is wider and longer than the near minimum image used for the normal bitline contacts.

The bitline contact opening is intentionally widened over the fuse element region to provide a large amount of overlap 23 over the gate conductor 20 edges. As is explained below, the large size of the bitline contact opening 31 over the fuse element 21 region relative to normal bitline contact, permits precise depth control of the subsequent recessing of the bitline poly stud 21 in the fuse area, while maintaining the desired amount of recess for the normal bitline poly studs.

The areas exposed by the bitline contact mask are removed by reactive ion etching (RIE) or other similar etching processes, such that the TEOS is opened to the depth of the surface of the substrate (silicon in the case of the bitline contacts; STI oxide in the fuse areas) in areas where bitline contacts are required. Further, because of the inventive change in the shape of the bitline mask, the TEOS is not only removed from the bitline contact regions, but is also removed from the wide opening 31 and from the area between the nitride spacers 30.

The agents used during the reactive ion etching are selected to etch materials such as the TEOS or BPSG at a much faster rate than they etch nitride. Therefore, the etching process removes the TEOS from the opening between the nitride spacers. However, the nitride cap 35 and spacers 30 suffer minimal etching. The etch is timed to assure that excessive overetching into the underlying STI oxide does not occur.

In the conventional manufacturing process, once the bitline contact mask is used to form the bitline contact openings, a bitline contact material, such as polysilicon, is deposited and etched down to a level sufficient to ensure that the polysilicon only remains in the bitline contacts formed through the TEOS. The invention takes advantage of this conventional polysilicon deposition and etching to form the inventive polysilicon fuse structure 21, without requiring additional processing steps.

More specifically, a reactive ion etching (RIE) or other suitable means is conventionally used to etch the polysilicon bitline contacts. However, the inventors have observed that a larger bitline contact opening will cause a greater etch rate of the bitline polysilicon. In other words, the etch rate of the bitline contact polysilicon is dependent on the bitline contact opening size.

Thus, in the areas where the bitline contact polysilicon should remain (i.e., the near photolithographic minimum bitline openings and in the sub-minimum space between the nitride spacers 30), the polysilicon is recessed at a much slower rate than in the wider opening 31.

Indeed, the width and length of the opening 31 are selected to accelerate the etching of the bitline contact polysilicon, such that the bitline contact polysilicon is removed from the wide area 31 and remains only in the conventional bitline contact openings and between the nitride spacers 30, so as to form the polysilicon on fuse element 21. Thus, by simply varying the shape of the bitline contact mask, the invention produces the sub-minimum polysilicon fuse element 21 without adding additional processing steps.

In conventional DRAM technologies, borderless bitline contacts are employed in the memory array. Borderless contacts allow very dense DRAM layouts to be achieved, which increases the number of chips per wafer and reduces the cost per bit. The inventive fabrication of electrically blowable fuses having sub-minimum width is easily adaptable the borderless contact process.

As mentioned above, the bitline contact opening is made substantially larger than what is conventionally used for a borderless contact. Since the etching depth of the bitline poly stud is highly dependent on the size of the bitline contact opening, the bitline poly stud 21 may be recessed below the top of the cap nitride 35 by controlling the width of the opening 31.

If the recess depth of the bitline poly stud (or other conductive fuse material) must be controlled independently of the size of the normal bitline contact opening, an additional mask may be used to open only the fuse areas to the recess etch. This mask would be relatively inexpensive, since it does not require critical alignment and it contains no minimum feature sizes.

Figure 4:
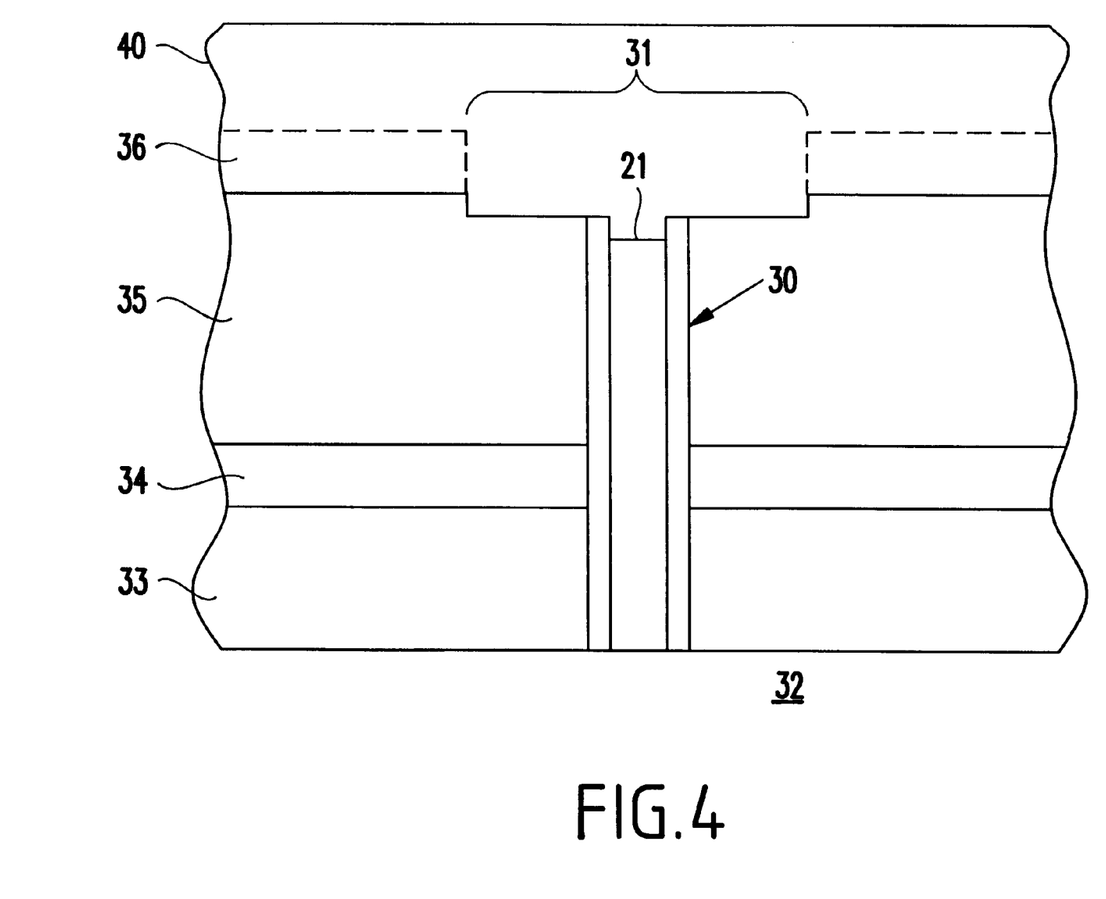
FIG. 4 is a schematic diagram of a cross-sectional the view of a first embodiment of the invention.
Figure 5:
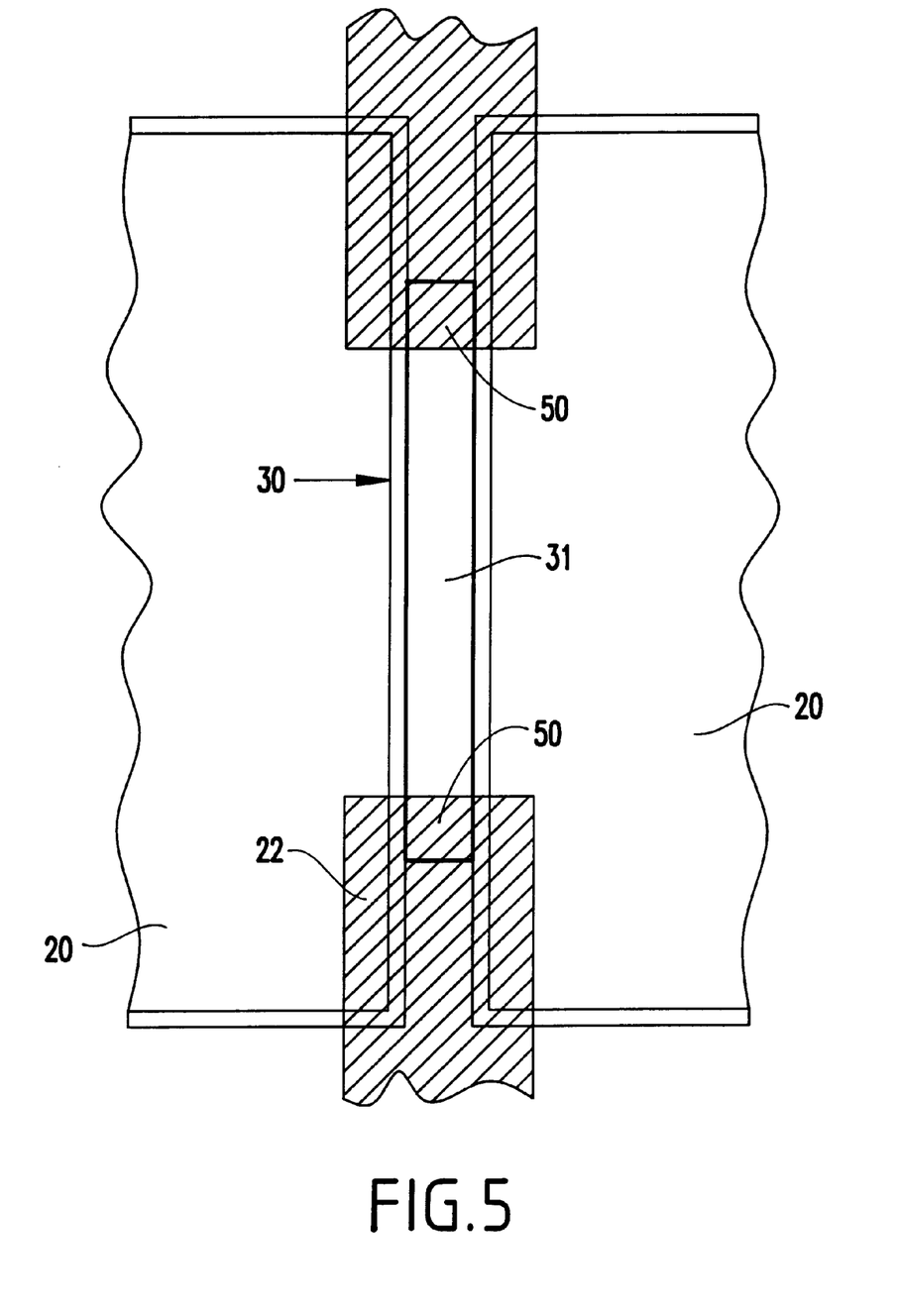
FIG. 5 is a schematic diagram of a top view of a completed structure of the first embodiment of the invention.

As shown in FIG. 4, an additional layer of TEOS 40 is deposited to prevent conductive wiring 22 from strapping the bitline poly stud fuse 21.

Following deposition and planarization of the second TEOS layer 40 a wiring channel is formed in the insulating layers 40, 36. The formation of the wiring channel exposes the ends of the fuse in the area 50 illustrated in FIG. 5. The wiring material 22 is then damascened into the wiring channel. The ends of the bitline wiring 22 contact the ends of the poly fuse element 21 at the area 50.

The inventive fuse described above has many advantages over prior art electrically blowable fuses. First, the sub-minimum width is achieved with conventionally practiced processes. This allows the inventive fuse to be easily and economically integrated into existing processes, without adding additional processing steps.

Additionally, the reduced width results in reduced cross-sectional area of the fuse. For a given fuse current, the current density in the fuse is enhanced by the reduced cross-sectional area. This allows the fuse to be opened at currents which are smaller than what is needed for fuses having larger cross-sectional areas.

Reduced current requirements for opening a fuse translate into fuses which can be opened at standard internal operating voltages and currents. Thus, the inventive fuse may be included in structures where it is necessary to blow fuses in the field, at the module level.

To the contrary, conventional fuses require voltages which are higher than standard internal operating voltages to open. These higher voltages must be supplied externally, thus making it undesirable to open conventional fuses in the field. Instead, conventional fuses are commonly blown at the wafer level, during the manufacturing process.

Further, the inventive fuse provides a current crowding effect which further reduces the blow current requirements. Referring to the top view of the completed fuse, shown in FIG. 5, current enters the fusible link portion 21 of the fuse (control bitline poly fuse) via the relatively very highly conductive wiring layer 22. Due to the, reduction in width between the conductive wiring level and the fusible poly link, current crowding occurs at the transition between these conducting lines.

Also, the inventive fuse is surrounded on all sides by materials which are poor thermal conductors. This results in increased fuse temperature for a given fuse current, contributing to a further reduction in required blow-current.

II. Second Embodiment

Figure 6:
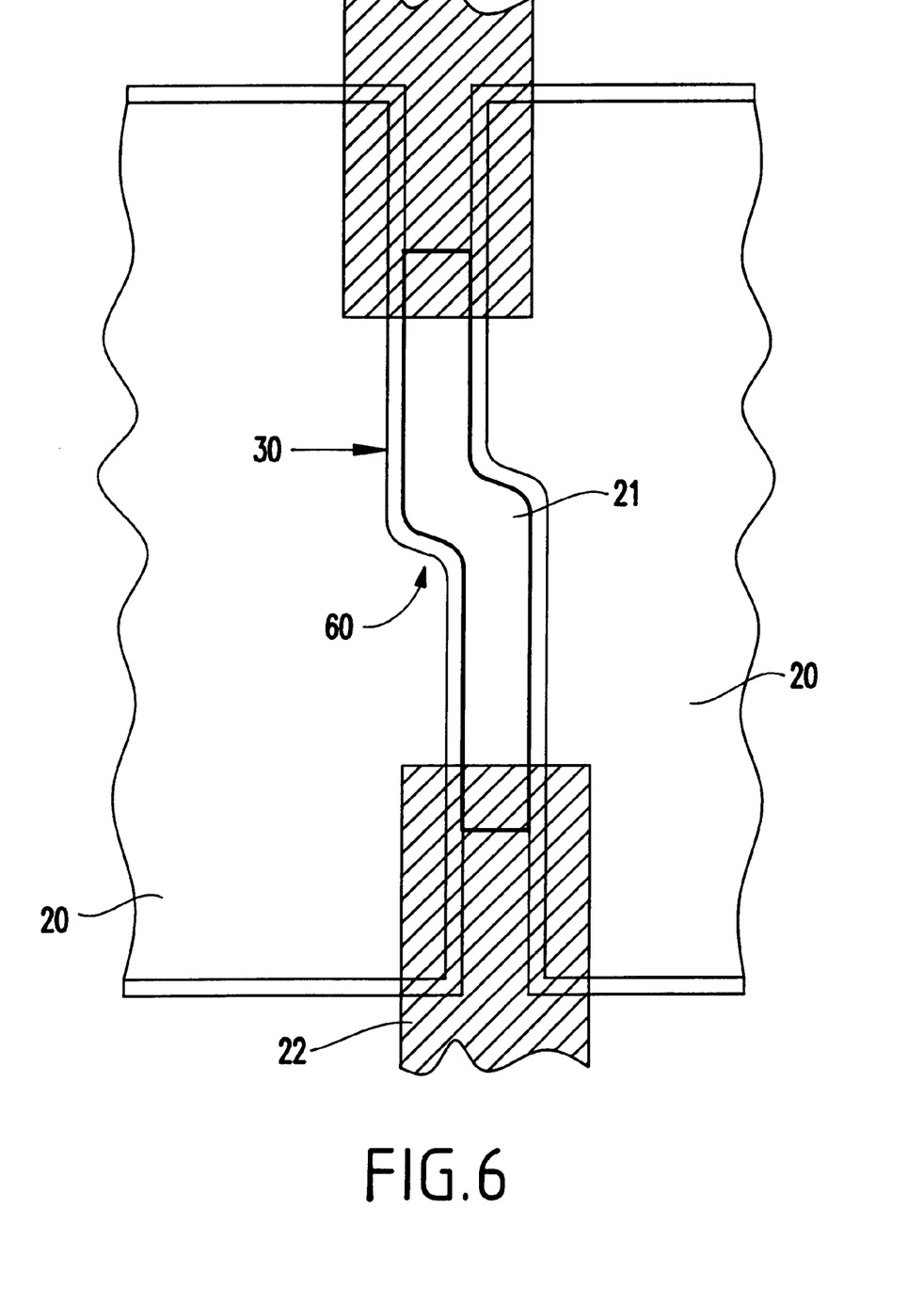
FIG. 6 is a schematic diagram of a top view of the a second embodiment of the invention.

A second embodiment of the invention is shown in FIG. 6. The structure illustrated in FIG. 6 is substantially similar to that illustrated in FIG. 5, and a detailed discussion of the redundant features is not included herein, for the sake of brevity. In the second embodiment the space between the gate conductors 20 is intentionally jogged to produce a fuse geometry containing a bend 60. The bend 60 results in additional current crowding, further reducing the current required to open the fuse. Such a jog or zig-zag pattern is formed by altering the gate conductor mask to have a corresponding jog pattern. The bitline contact mask is still significantly larger than for the normal bitline contacts.

Thus, with the invention, a sub-minimum width fuse is formed utilizing conventional DRAM process. The invention uses the bitline polysilicon stud level to obtain the sub-minimum width. Further, the bitline poly stud conductor has a high resistance relative to the gate conductor and the conductive wiring levels. Lastly, the fuse is surrounded by low thermal conductivity materials for enhanced heating (e.g., STI below, nitride spacers on the sides and TEOS on top).

This inventive structure, which is set between gate conductor stacks over an insulated part of the substrate, is electrically blowable, and does not have to be accessed by laser radiation or supplied with voltage from an external source.

III. Third Embodiment

A third embodiment of the invention which significantly reduces the heat loss from the fuse and further reduces the blow current requirements is illustrated in FIGS. 7–12. The third embodiment of the invention includes all the features of the first and second embodiment. Therefore, a detailed discussion of the features described above in the first and second embodiments is not repeated here, for the sake of brevity.

Figure 7:
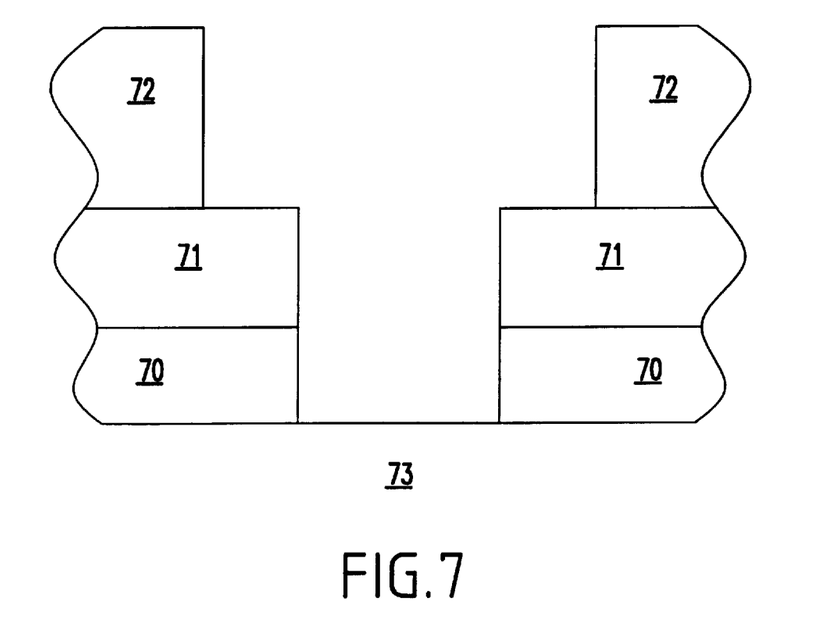
FIG. 7 is a schematic diagram of a cross-sectional view of a third embodiment of the invention.
Figure 8:
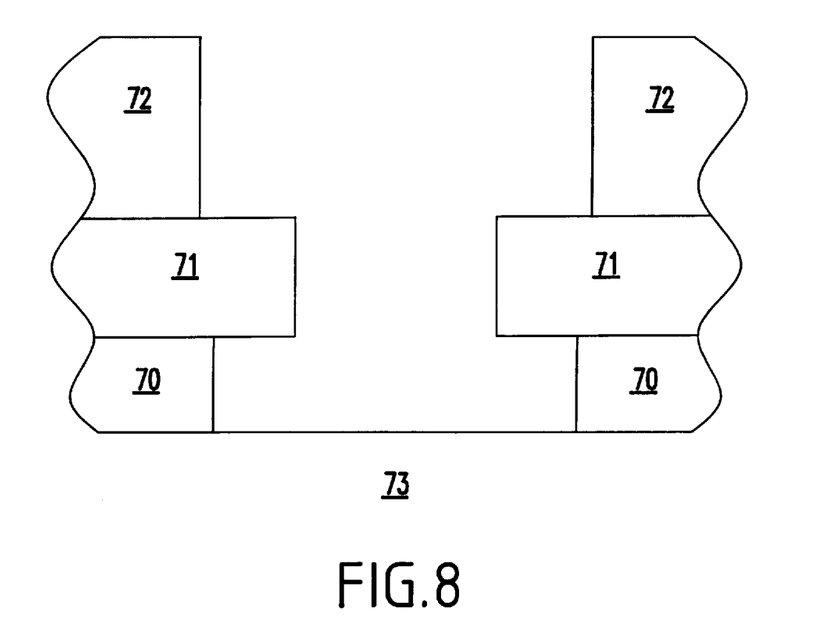
FIG. 8 is a schematic diagram of a cross-sectional view of a third embodiment of the invention.

With the third embodiment, gate conductor lines 70 are formed over a shallow trench isolation region 73 and capped by nitride 71, as with the first and second embodiments. As mentioned in the description of the first and second embodiments, the gate conductor 70 could include polysilicon and tungsten silicide layers. A photoresist mask 72 is used in an etching process to undercut the gate conductor 70 relative to the overlying nitride cap 71, as shown in FIG. 8.

Figure 9:
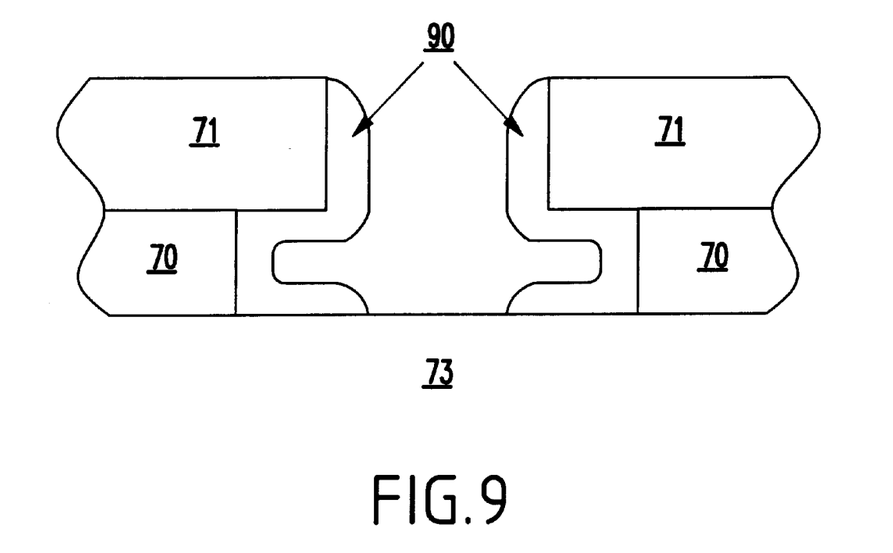
FIG. 9 is a schematic diagram of a cross-sectional view of a third embodiment of the invention.

The mask 72 is removed as shown in FIG. 9 and a layer of low pressure CVD (chemical vapor deposition) nitride 90 is conformally deposited over the surface. A reactive ion etch (RIE) is then used to finalize the nitride spacers 90, as shown in FIG. 9.

Figure 10:
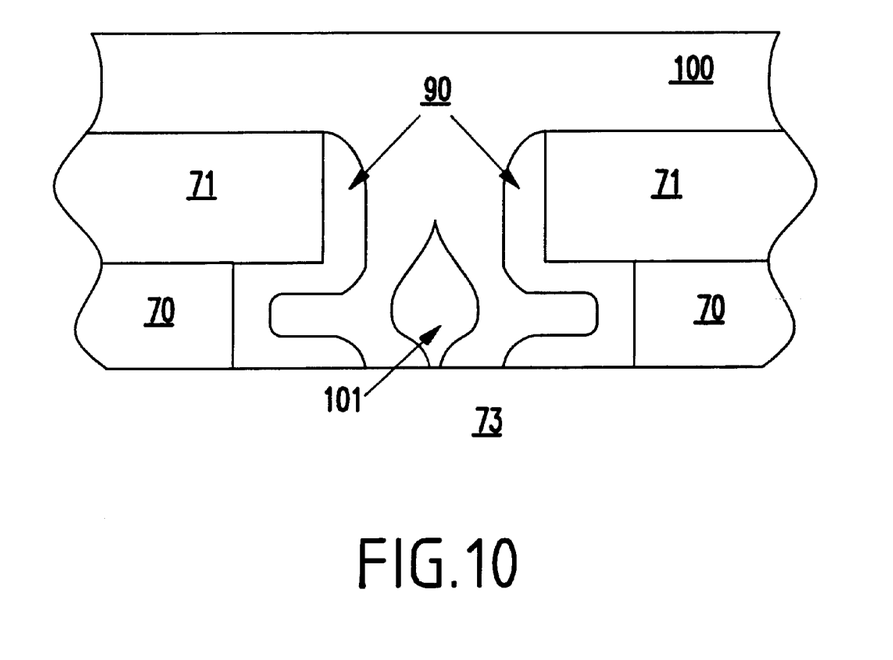
FIG. 10 is a schematic diagram of a cross-sectional view of a third embodiment of the invention.

A layer of TEOS (or BPSG as in the standard process) 100 is deposited and planarized as shown in FIG. 10. A void 101 is formed in the TEOS layer 100 as the TEOS material conforms with the shape of the nitride spacers, as shown in FIG. 10.

Figure 11:
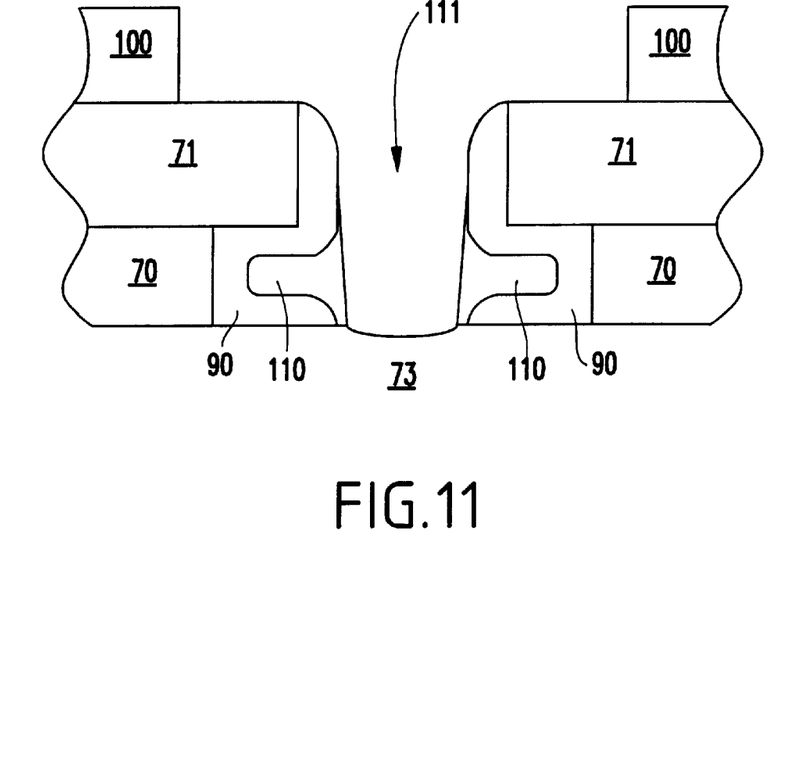
FIG. 11 is a schematic diagram of a cross-sectional view of a third embodiment of the invention.

Using a bitline contact mask, the exposed TEOS is etched in a reactive ion etch, as shown in FIG. 11. An opening 111 is formed between the gate conductor mandrels 70, 71, 100. The width of the opening 111 is defined by the original opening between gate conductors (FIG. 7) and by the space between nitride spacers 90. A region of TEOS 110 remains within gaps of the nitride spacer 90, due to the conformal deposition of the nitride layer 90.

Figure 12:
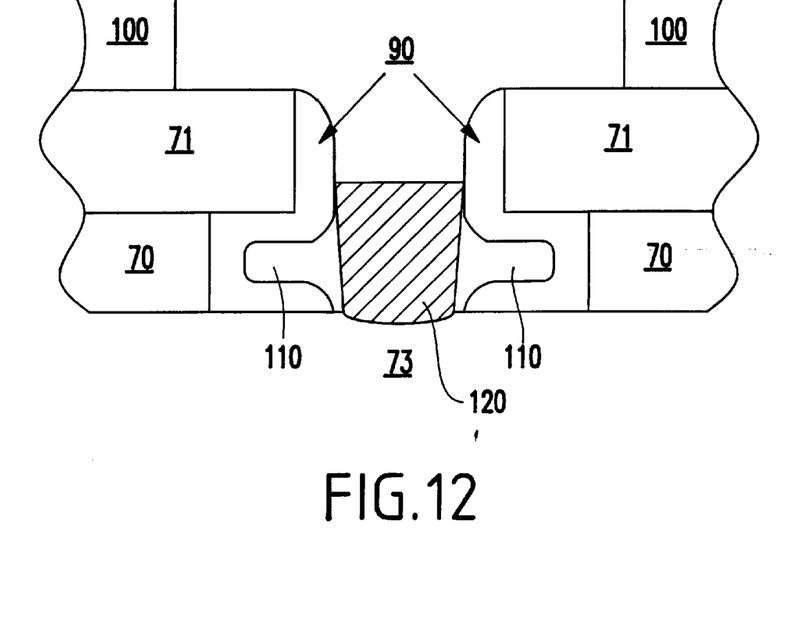
FIG. 12 is a schematic diagram of a cross-sectional view of a third embodiment of the invention.

A bitline stud polysilicon 120 is deposited and recessed within the opening 111, as shown in FIG. 12. Processing as described in the earlier embodiments follows, to complete the fuse.

Due to the intentionally wider bitline contact size in the fuse areas relative to the bitline contacts in the array (described above in the previous embodiments), the recessing of the polysilicon 120 is greater than the recessing of the remainder of the bitline studs for the array. Thus, the inventive fusible link has a height and cross-sectional area which is further minimized. Therefore, the invention produces a fuse which can be opened using the voltages normally present in the semiconductor device.

IV. Fourth Embodiment

Figure 13:
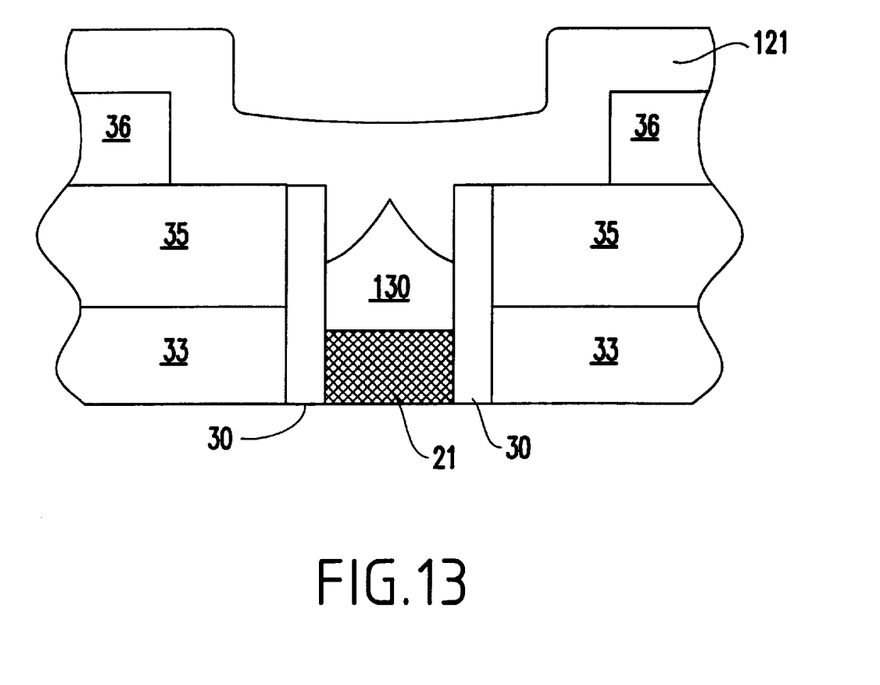
FIG. 13 is a schematic diagram of a cross-sectional view of a fourth embodiment of the invention.

The fourth embodiment of the invention is illustrated in FIG. 13. The fourth embodiment is substantially similar to the first embodiment, except that the fourth embodiment includes a cavity above the fuse to absorb the products produced by the blowing process. Once again, a detailed discussion of the features described in the previous embodiments is not repeated here, for the sake of brevity.

Available data on encapsulated, electrically blowable, polysilicon fuses shows that a fuse may be opened without causing damage to nearby structures. However, in certain situations it may be desirable to provide a cavity above the fuse to absorb the blown fuse products because it is conceivable that the thermal energy produced in the fuse by the blow pulse, under some circumstances, may result in some damage to neighboring structures. This is dependent on the characteristics (i.e., amplitude, waveform) of the blow pulse.

The structure of the fourth embodiment is fabricated using the steps explained above with respect to the first embodiment. The corresponding elements of the structure shown in FIG. 13 have been assigned the same identification numbers corresponding to the elements discussed above with respect to the first embodiment The fourth embodiment differs from the first embodiment in that once the polysilicon fuse element 21 is recessed below the top of the cap nitride 35 by the bitline stud etching process, the structure is encapsulated with a dielectric 121. The deposition conditions are adjusted to produce a void 130 above the fuse conductor 21, as would be known by those ordinarily skilled in the art given this disclosure. For example, angled collimated sputtering of the second insulating layer 121 is one means of bridging the gap 120 above the fuse.

Therefore, with the fourth embodiment, the invention includes a gap 130 which can receive the materials produced during the fuse opening process and thereby protect surrounding structures from any potential damage.

V. Fifth Embodiment

Figure 14:
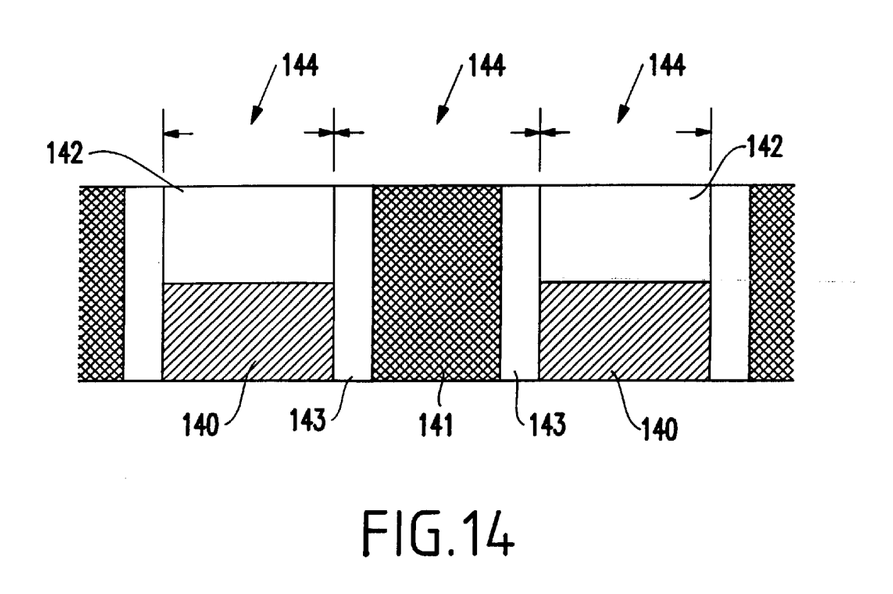
FIG. 14 is a schematic diagram of a cross-sectional view of a fifth embodiment of the invention.

A fifth embodiment of the invention is an interleaved wiring structure having a sub-minimum width conducting line between two mandrels and is illustrated in FIG. 14. The fifth embodiment is also fundamentally similar to the previous embodiments and a detailed discussion of the redundant features is avoided here, for the sake of brevity.

More specifically, the fifth embodiment includes pairs of conducting lines 140, between a third conducting line 141. The overall pitch of the combined conducting lines 140 and 141 is twice the pitch of the highest possible lithographic wiring pitch. In other words, twice the number of conductor lines 140 and 141 are formed per unit width than is possible with the most advanced lithograph techniques. This allows the wiring density to be increased accordingly. The lines (mandrels) can be formed by many methods well-known to those ordinarily skilled in the art. For example, the lines could be formed purely by photolithographic means.

Conductor lines 140 include an insulating cap 142 and may be formed, for example, by patterning the conductor lines 140 using a conventional subtractive etch process (reactive ion etching or wet etching). Once the conductor lines 140 are etched, insulating sidewall spacers 143 are formed. Then a second conductor line 141 is deposited and planarized to the top of the dielectric 142. A passivating insulating film (not illustrated) may then be deposited.

The foregoing process produces the structure shown in FIG. 14. The conductor line 141 has a sub-minimum width. More specifically, the minimum lithographic resolution is shown by widths 144. The presence of the sidewall spacers 143 reduces the width of the conductive line 141 below the smallest possible lithographic width.

Conventionally, the space between the conductor lines 40 was used exclusively to insulate the conductor lines 40 from one another. However, the invention forms a second conductor line 141 in the area conventionally occupied only by an insulator. Therefore with the invention, a higher line density can be achieved which reduces the overall size and power consumption of the semiconductor structure. Therefore, the invention is able to form two conductors (i.e. 140 & 141) in the same width that is conventionally occupied by one conductor.

As would be known by one ordinarily skilled in the art given this disclosure, the conductor lines 140 could be any form of structure which comprise mandrels. For example, the sub-minimum wiring 141 could be formed between gates conductor stacks which, as described above, act as mandrels.

VI. Sixth Embodiment

Figure 15:
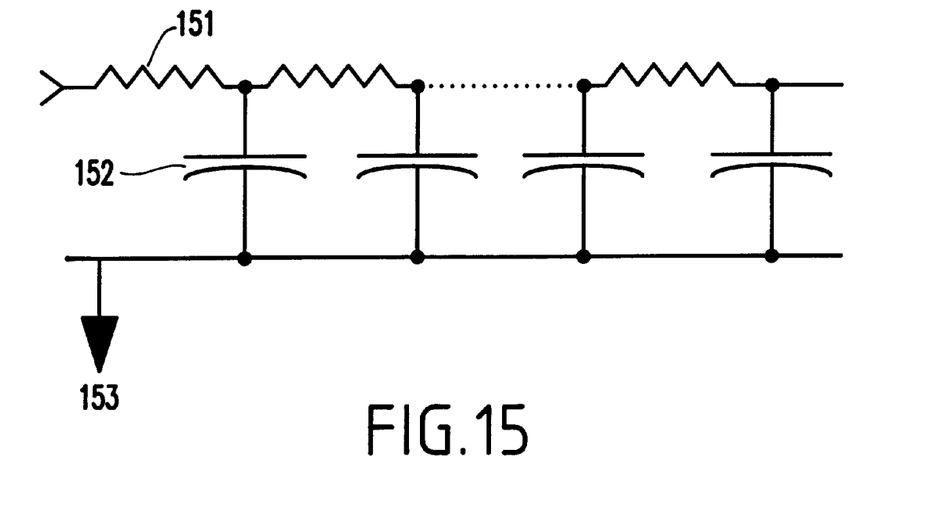
FIG. 15 is a schematic circuit diagram of an RC circuit.
Figure 16:
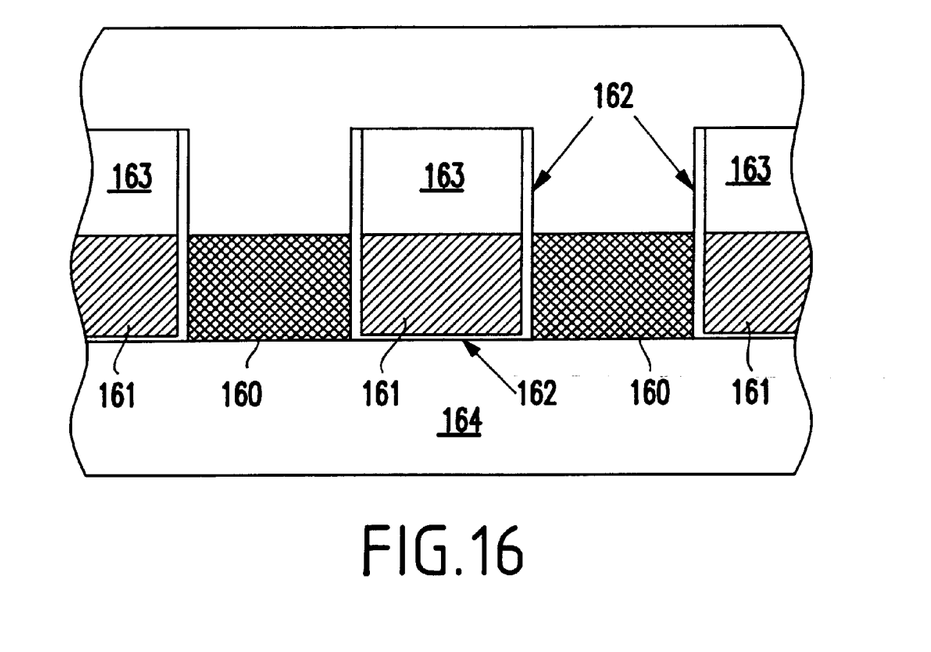
FIG. 16 is a schematic diagram of a cross-sectional view of a sixth embodiment of the invention.

The sixth embodiment, which is illustrated in FIGS. 15 and 16, comprises a distributed RC decoupling filter/distributed RC lowpass filter which is used in structures which have low frequency signal lines which must be free of high frequency noise. The inventive structure may also be employed in a power supply line which must be free of noise. Indeed, any conventional structure which uses conventional lumped element RC filters can use the inventive structure described herein.

Once again, the structure and method of the sixth embodiment is fundamentally similar to the previous embodiments, and a detailed discussion of the features, discussed above with respect to the previous embodiments, is not repeated here, for the sake of brevity.

FIG. 15 illustrates a circuit schematic of a distributed RC filter. The filter circuit includes resistors 151, capacitors 152 and a ground 153. The capacitors 152 are connected in parallel with a resistor 151 interposed in between on a line opposite the ground. FIG. 16 illustrates a schematic cross-sectional view of a semiconductor structure which is equivalent to the circuit shown in FIG. 15.

As shown in FIG. 16, high conductivity (e.g., metallic) lines 160 are formed between lower conductivity lines 161. As with the previous embodiments, the lower conductivity lines 161 serve as mandrels. The lower conductivity lines may be gate conductors comprising polysilicon; either uncapped or capped with silicide. These structures may be formed by the methods discussed above or other similar methods well known to those ordinarily skilled in the art.

Following the delineation of the gate conductors, which are capped by an insulating layer 163 in FIG. 16, a high dielectric sidewall spacer material 162 is deposited instead of the customary nitride sidewall spacer mentioned in the previous embodiments. The high dielectric material 162 may include tantalum pentoxide (TaO5), barium-strontium-titanate-oxide [$(Ba_{0.7}Sr_{0.3})Ti_{1.0x}O_3$] or other high permitivity material. A barrier metal, such as Ruthenium (Ru) or Platinum (Pt), (not illustrated) may be used with the dielectric, as is known in the art, for high capacitance stacked capacitor DRAM cells.

The substrate 164 upon which the filter is formed is preferably of high conductivity. The substrate 164 illustrated in FIG. 16 is a diffused silicon substrate. A lower metalization layer may be used for the substrate, if the gate conductor level is not utilized as the mandrel. Alternatively, the highly conductive substrate may comprise a high concentration diffusion in a semiconducting substrate.

With this embodiment, sub-minimum width, highly conductive lines 160 contact the underlying highly conductive substrate 164. This structure provides enhanced capacitance from the signal line to ground through the dielectric 164 under the mandrel conductor 161.

The dielectric 164 under the mandrel conductor 161 is not necessarily a gate dielectric and may also be a high dielectric material. The gate conductor 161 (or other higher resistivity line) serves as the signal line and the highly conductive lines 160 serve as the low noise reference.

The inventive structure provides a compact means of obtaining very high distributed capacitance. In normal VLSI (very large scale integration) wiring, the space between conductors 161 is insulation and the capacitance must be obtained from lumped MOS (metal oxide semiconductor) or junction capacitors (i.e. discrete elements). Further, both lines 160 and 161 may comprise high-conductivity material to form a low loss LC (inductor/capacitor) transmission line.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A semiconductor device having a plurality of wiring lines, said device comprising:

a plurality of conductors, each of said conductors having a conductive layer and an insulating layer above said conductive layer, wherein a first width between said conductive layer of adjacent ones of said conductors is greater than a second width between said insulating layer of adjacent ones of said conductors;

first spacers positioned on said insulating layer and said conductive layer of adjacent ones of said conductors;

a fuse element positioned between said first spacers of adjacent ones of said conductors and connected to said wiring lines; and second spacers positioned between said fuse element and said first spacers, said second spacers being on a same layer level as said conductive layer, wherein a difference between said first width and said second width is filled by said second spacers.

2. The semiconductor device as in claim 1, wherein said second spacers increase thermal insulation of said fuse element.

3. The semiconductor device as in claim 1, wherein said first spacers comprise nitride, said second spacers comprise tetraethylorthosilicate and said fuse element comprises polysilicon.

4. The semiconductor device as in claim 1, wherein said first width comprises a smallest possible photolithographic width and said fuse element has a third width smaller than said first width.

5. The semiconductor device as in claim 1, wherein said conductors comprise gate conductor stacks.

6. The semiconductor device as in claim 1, wherein said fuse element is opened with internal operating currents and voltages of said wiring lines.

7. The semiconductor device as in claim 1, wherein said fuse element has a bend.

8. The semiconductor device as in claim 1, further comprising a void above said fuse element.

* * * * *